United States Patent [19]

Rogers, Jr. et al.

[11] Patent Number: 4,859,492
[45] Date of Patent: Aug. 22, 1989

[54] PROCESS FOR FORMING AN ENVIRONMENTALLY STABLE OPTICAL COATING THEREBY

[75] Inventors: Harvey N. Rogers, Jr., Los Angeles; Ronald T. Smith, Redondo Beach, both of Calif.

[73] Assignee: Hughes Aircraft Company, Los Angeles, Calif.

[21] Appl. No.: 99,697

[22] Filed: Sep. 21, 1987

Related U.S. Application Data

[63] Continuation of Ser. No. 831,896, Feb. 24, 1986, abandoned.

[51] Int. Cl.$^4$ .......................... B05D 3/06; B05D 5/06
[52] U.S. Cl. ..................................... 427/42; 427/162; 427/164; 427/167; 427/255; 427/255.3
[58] Field of Search ................. 427/42, 35, 53.1, 162, 427/164, 167, 255, 255.3, 255.7; 428/428, 446, 702, 913

[56] References Cited

U.S. PATENT DOCUMENTS

| | | | |
|---|---|---|---|
| 2,920,002 | 1/1960 | Auwarter | 427/162 |
| 3,808,035 | 4/1974 | Stelter | 427/162 |
| 4,100,330 | 7/1978 | Donley | 427/167 |
| 4,206,251 | 6/1980 | Chen | 427/167 |
| 4,206,252 | 6/1980 | Gordon | 427/162 |
| 4,272,588 | 6/1981 | Yoldas et al. | 427/167 |
| 4,329,016 | 5/1982 | Chen | 427/167 |
| 4,361,598 | 11/1982 | Yoldas | 427/162 |
| 4,371,587 | 2/1983 | Peters | 427/255.3 |
| 4,430,366 | 2/1984 | Crawford | 427/162 |
| 4,545,646 | 10/1985 | Chern et al. | 427/126 |

FOREIGN PATENT DOCUMENTS 57-158834 9/1982 Japan .................................... 427/162

OTHER PUBLICATIONS

Cohen et al, "Optical and Electrical Properties of Lead Silicate Glasses", J. of Non-Crystalline Solids, vol. 12, pp. 177–188, 1973.
Li et al, "CVD Hydrophobic Lead Silicate Films", Journal of Electrochen. Soc.: Solid State Science & Technology, pp. 165–172, Jan. 1982.

Primary Examiner—Sadie Childs
Attorney, Agent, or Firm—Mary E. Lachman; A. W. Karambelas

[57] ABSTRACT

An optical coating which is stable upon sustained exposure to water vapor is provided by a low-temperature photochemical vapor deposition process. First, there are provided a first vapor phase reactant containing silicon, a second selected vapor phase reactant, and an oxygen-containing precursor which are capable of interacting upon radiation inducement to form the corresponding oxides of the vapor phase reactants. A chosen substrate is exposed to the first and second selected vapor phase reactants in predetermined proportions and the chosen oxygen-containing precursor in the presence of radiation of a predetermined wavelength to induce a reaction to form a coating on the substrate. The coating comprises silicon dioxides containing a predetermined proportion of the second oxide, such as lead oxide. The coating maintains stable optical properties upon sustained exposure to water vapor. Graded index optical elements as well as quarterwave stack structure may be formed by this process.

7 Claims, 3 Drawing Sheets

PROCESS FOR FORMING AN ENVIRONMENTALLY STABLE OPTICAL COATING THEREBY

This application is a continuation of application Ser. No. 831,896, filed Feb. 24, 1986 now abandoned.

BACKGROUND OF THE INVENTION

1. Field of the Invention

This invention relates generally to the field of reflective optical materials, and, more particularly, to a process for forming an environmentally stable optical coating for reflective diffraction optical elements, such as optical filters, and to the structures formed by such a process.

2. Description of the Background Art

In various optical systems, it is often necessary to provide a filter in order to remove undesired radiation while at the same time allowing desired radiation to be efficiently transmitted or reflected. Such filters and coatings are used, for example, to provide protection from laser radiation for personnel, for electro-optical detectors, and for optical mirrors in a laser system, as a holographic lens in a head-up display system, or in night vision visors. The optical filters currently used for such purposes include absorption filters, reflective multiple layer dielectric filters, and diffraction filters generated by optical holographic techniques. However, each of these approaches to providing optical filters has certain disadvantages, as discussed below.

The absorption filter comprises a material which is impregnated with absorption dyes or materials with intrinsic absorption at the wavelength of the incoming laser radiation, as described, for example, in th book entitled "Handbook of Optics", W. G. Driscoll, ed., McGraw-Hill Book Co., New York, 1978, in Section 8 (Coatings and Filters), at pages 7 to 32. This type of protection has the serious disadvantage that the spectral bandwidth of the absorbing dye is so broad that the amount of transmitted radiation decreases to unacceptably low levels. In addition, for laser applications, as the laser radiation energy increases, the radiation can damage the protective filter itself.

The reflective multiple layer dielectric filters typically consist of alternate layers of two dielectric materials of different refractive indices, which are formed on the surface of a substrate by known deposition techniques, such as chemical vapor deposition, sputtering, or thermal evaporation. When the optical thickness of each layer is chosen to be one-quarter of the wavelength of the radiation being reflected, such a structure is referred to as a "quarterwave stack", as discussed, for example, in U.S. Pat. No. 4,309,075 and in the book entitled "Handbook of Optics", previously referenced, in particular in Section 8. However, there are limitations on the spectral bandwidths which can be achieved by such structures, because of the limited material combinations available and the resulting restriction on the choices of index modulations. Moreover, defects at the abrupt interfaces between the layers in a multilayer structure can cause unwanted optical scattering. In addition, these defects can cause excessive absorption of radiation by the dielectric material, which can result in thermal damage to the optic filter. Furthermore, in a multilayer dielectric coating, the electric field is strongest at the interface regions between the high index material and the low index material. This highly localized field occuring at the abrupt interfaces can produce maximum temperature increases. Since the thermal expansion coefficients are different for the different dielectric materials of adjacent layers, high thermal stress is developed at the interface regions, which could cause delamination of the successive layers in the film. In addition, the high thermal stress could create microscopic dislocations which result in unwanted optical scattering by the film. Further, substrate roughness, pinholes and contaminants in the conventional multilayer structures formed by evaporation or sputtering techniques increase absorption and scattering, generate localized heating, reduce maximum reflectivity, and increase radiation damage. Finally, these multilayer coatings exhibit reflectance peaks at multiple wavelengths, which causes reduced optical transmission.

Diffraction optical elements have been generated using known methods of optical holography in photosensitive gelatin material, as discussed, for example, in the book entitled "Optical Holography", by Collier, Burckhardt, and Lin, Academic Press, New York, 1971, Chapter 9 (Diffraction from Volume Holograms) and Chapter 10 (Hologram Recording Materials), as well as in the book entitled "Handbook of Optical Holography", by Caulfield, Academic Press, New York, 1979, Chapter 10 (Application Areas). However, gelatin diffraction elements have environmental stability problems and are susceptible to degradation by humidity and heat. In order to overcome this problem, a protective layer such as glass or a glass-like coating can be used, but such a layer complicates the manufacturing process and adds to unit cost. Moreover, such gelatin filters are limited to use for radiation in the wavelength range from the visible to the near infrared since sensitized gelatin is not sensitive to longer wavelength exposures. Consequently, filters for infrared applications cannot be fabricated in a gelatin structure. In addition, the index modulation in the gelatin, which is produced by exposure to the holographic interference pattern and subsequent development, is limited to a shape approximating a sinusoidal configuration or a roughly superimposed multiple sinusoidal configuration. Furthermore, the fabrication of a gelatin filter requires numerous steps, in particular numerous wet chemical steps for development, which are sensitive to processing variables, such as temperature or vibration, that affect the efficiency and peak wavelength of the final structure. In addition, since the resistance of gelatin to damage by heat or radiation is relatively low, gelatin filters are limited to low power applications. Finally, fabrication of a filter which reflects radiation at two selected wavelengths requires multiple exposure of the gelatin to two holographic patterns, which produces an irregular index profile that reduces the efficiency of the filter.

A high efficiency diffraction optical element has recently been developed to overcome many of the above-discussed problems and is described in U.S. Pat. No. 4,545,646 to Chern et al, assigned to the present assignee. This new diffraction optical element comprises a substrate having deposited thereon a graded index material in which the material has continuous gradations in refractive index in a predetermined pattern or profile as a function of the thickness of the layer. The pattern or profile of the refractive index is chosen to provide the desired optical properties, such as the reflection of light of a particular wavelength or wavelengths. This graded index material is formed by a photochemical vapor deposition process by exposing a chosen substrate to two or more selected vapor phase reactants which interact upon radiation inducement to produce the chosen material, and varying the relative proportions of the reactants in a predetermined and continuous sequence to produce continuous gradations in the stoichiometric composition of the chosen material deposited and corresponding gradations in the refractive index of the deposited layer as a function of the thickness of the layer and in a predetermined pattern. For example, such a graded index material may vary in composition from SiO with a refractive index of 1.9 to $SiO_2$ with a refractive index of 1.45. The structure and process of Chern et al possess numerous advantages. First, the $SiO_x$ formed by such a photochemical vapor deposition process exhibits superior adhesion on glass, as well as plastics such as polycarbonate, and conforms to the shape of the substrate surface. This property makes the Chern et al process especially useful for the fabrication of head-up display combiners or night vision visors on curved substrates. Moreover, the $SiO_x$ formed by photochemical vapor deposition can be deposited at a temperature sufficiently low (e.g. 30° to 200° C.) so as to avoid thermal degradation of a plastic substrate, which makes possible the use of light-weight plastic substrates in laser eye protection devices and head-up display devices. Further, the $SiO_x$ so formed possesses excellent optical and mechanical properties, such as good surface morphology and low pinhole or defect density, which result in reduced optical scattering. In addition, the low defect density of such an oxide makes it less susceptible to laser radiation damage. Further, the continuously graded index material of Chern et al avoids the previously discussed prior art problems, such as reduced transmission, optical scattering, and thermal damage, caused by the juxtaposition of discrete layers of differing composition. In addition, the prior art problems of localized concentration of mechanical stresses as well as a concentration of the electric field are avoided. Further, the gradual change in composition in the material of Chern et al reduces the thermal stress in the film when subjected to high laser energy flux, which increases the laser damage threshold. Finally, the process of Chern et al can provide a device with high reflection of radiation within a narrow bandwidth to thus provide high transmission of the signal of interest and enhanced efficiency of signal detection.

The structure of Chern et al overcomes numerous problems encountered in the prior art and offers several additional advantages. However, it has recently been found that silicon oxide ($SiO_x$) materials formed by photochemical vapor deposition are not stable upon extended exposure to moisture and filters formed from such materials undergo a decrease in reflectance in the presence of humidity. This characteristic of silicon oxide materials severely limits the application of such filters, especially when high reflectance and small tolerances in peak wavelength are desirable.

The present invention is directed to the alleviation of the prior art problem of the environmental instability of silicon oxide materials formed by photochemical vapor deposition, while at the same time maintaining the numerous advantages of the structures and process of Chern et al.

SUMMARY OF THE INVENTION

The general purpose of the present invention is to provide a new and improved optical coating which is stable upon sustained exposure to water vapor. When such a coating is used as a diffraction optical element, it possesses most, if not all, of the advantages of the previously discussed prior art diffraction optical elements, while overcoming their above-mentioned significant disadvantages.

The general purpose of the present invention discussed above may be accomplished by providing a first vapor phase reactant containing silicon, a second selected vapor phase reactant, and an oxygen-containing precursor which are capable of interacting upon radiation inducement to form the corresponding oxides of the vapor phase reactants. A chosen substrate is exposed to the first and second selected vapor phase reactants in predetermined proportions and the chosen oxygen-containing precursor in the presence of radiation of a predetermined wavelength to induce a reaction to form a coating on the substrate. The coating comprises silicon dioxide containing a predetermined proportion of the oxide formed from the second vapor phase reactant, such as lead oxide. The coating maintains stable optical properties upon sustained exposure to water vapor. In one embodiment of the invention, a graded index optical element is formed by varying the proportions of the first and second vapor phase reactants in a continuous and predetermined manner as a function of time to form a coating having a continuously graded refractive index. In a second embodiment of the invention, a quarterwave optical stack structure is formed by varying the proportions of the vapor phase reactants in a step-wise manner to form discrete layers of the coating which have different refractive indices.

Accordingly, it is a further purpose of the present invention to provide a process for forming the above-described environmentally stable optical coating.

Another purpose is to provide a process of the type described in which a low temperature is used in order to avoid thermal damage to the substrate.

Still another purpose is to provide an environmentally stable optical coating having low optical scattering, low absorbance, good abrasion resistance, and good adhesion to the substrate.

A further purpose is to provide diffraction optical elements which are environmentally stable.

The foregoing and other advantages and features of the present invention will become more readily apparent from the following more particular description of the preferred embodiments of the invention, as illustrated in the accompanying drawings.

DETAILED DESCRIPTION OF THE INVENTION

Figure 1:
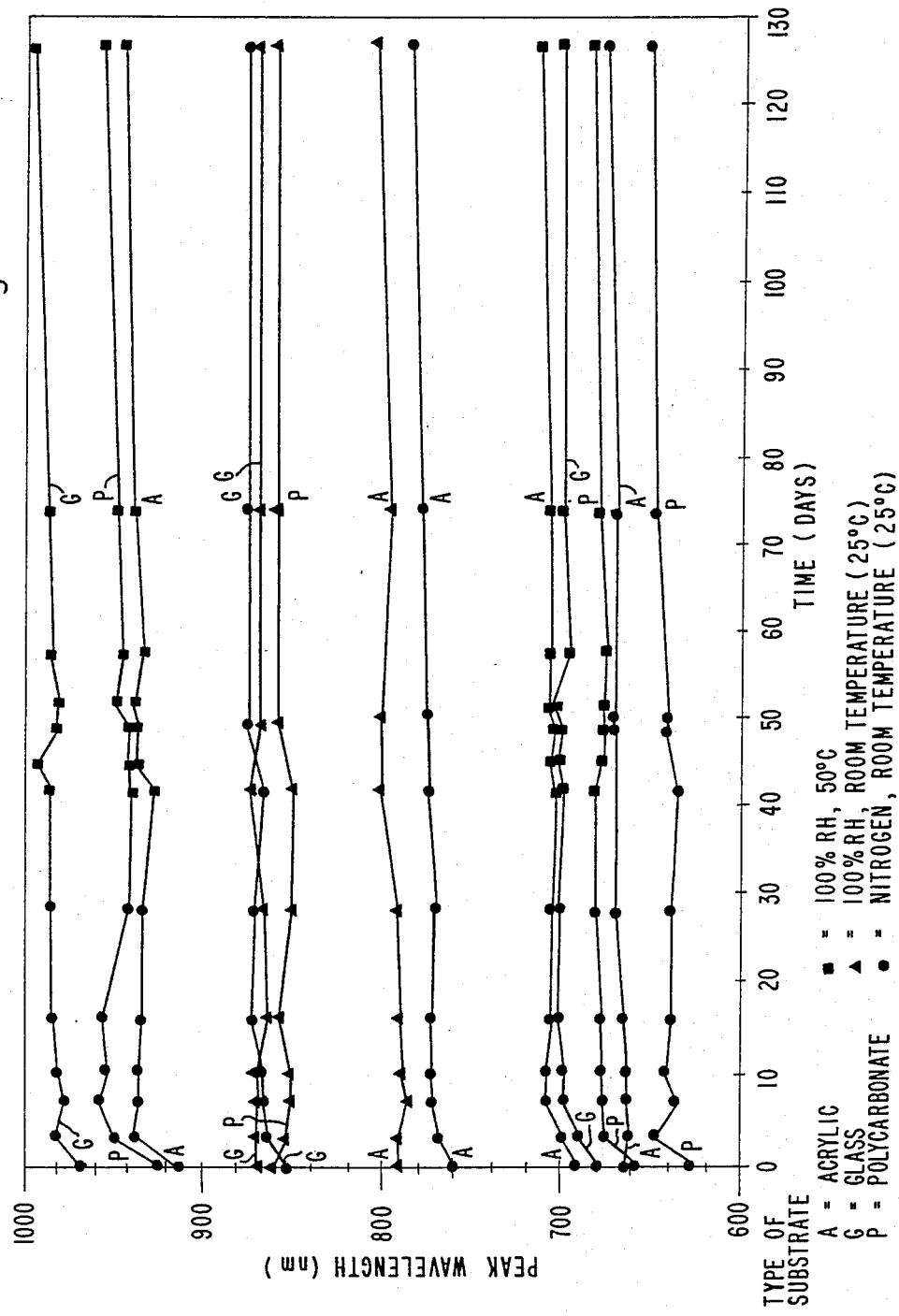
FIG. 1 presents a graph showing the stability of the peak wavelength of reflectance for various coatings formed in accordance with the present invention, upon extended exposure to water vapor.

In accordance with the present invention, an optical coating is formed on the surface of a chosen substrate by a photochemical vapor deposition process as described in U.S. Pat. Nos. 4,371,587 and 4,545,646, both assigned to the present assignee, and the details of which are hereby incorporated by reference. We have discovered that coatings of lead silicate formed by such a photochemical vapor deposition process possess significantly improved stability to water vapor as compared to prior art silicon oxide ($SiO_x$) materials formed by photochemical vapor deposition. The lead silicate coatings of the present invention may be used to form either the graded index optical filters described in U.S. Pat. No. 4,545,646 or the prior art quarterwave stack structure, to provide filters having the desired optical properties and additionally having environmental stability which was heretofor unattainable.

In order to form such optical structures, it is necessary to have one relatively high refractive index material and one relatively low refractive index material so that a sufficiently wide variation in refractive indices may be obtained. For the low index material, silicon dioxide is highly suitable and convenient to use. Other suitable materials which may be substituted for silicon dioxide are those which: (1) provide the low refractive index as required to form the final structure; (2) are stoichiometric oxides which are chemically stable; (3) can be deposited by low-temperature photochemical vapor deposition; (4) are transmissive to the wavelengths of radiation used in the photochemical reaction; and (5) are transmissive to the wavelengths of radiation used in the final optical structure.

The second material for forming optical structures is selected to provide a relatively high refractive index as compared to $SiO_2$ with a refractive index of 1.46, so that sufficient variations in refractive index can be achieved to provide the above-discussed optical structures. In addition, the second oxide must be capable of being deposited by low-temperature photochemical vapor deposition. The oxide so formed must be a stoichiometric oxide which is chemically stable and does not exhibit variations in oxide content in the manner that $SiO_x$ does. Moreover, the second oxide must be transmissive in the ultraviolet range in order to permit the reaction-inducing radiation to enter the reaction chamber while passing through any deposited material on the reaction chamber window. Further, this second oxide must be transmissive to the wavelengths of radiation as required by the end use of the optical structure formed therefrom.

Lead silicate is formed in accordance with the process of the present invention by providing a first vapor phase reactant containing silicon, such as silane ($SiH_4$) or disilane ($Si_2H_8$) and a chosen oxygen-containing precursor, such as nitrous oxide ($N_2O$) which can be photodissociated to form atomic oxygen. The photodissociation of the oxygen-containing precursor may be produced by direct dissociation by radiation of a selected wavelength (i.e. 1849 Å for $N_2O$) or by mercury-sensitized dissociation using 2537 Å radiation. Other suitable oxygen-containing precursors include nitrogen dioxide ($NO_2$) and molecular oxygen under selected pressure and flow rate conditions. The second vapor phase reactant is capable of reacting with the atomic oxygen to form the corresponding oxide which must meet the requirements previously discussed. Alternatively, the second vapor phase reactant may be dissociated by direct radiation or by a mercury-sensitized process to form an active radical which then reacts with the other reactants to form the desired product. In accordance with a preferred embodiment of the present invention, the second vapor phase reactant contains lead and may be, for example, tetraethyl lead. Other suitable compounds for the second vapor phase reactant include titanium ethoxide which is oxidized to titanium dioxide, and tantalum ethoxide which is oxidized to tantalum pentoxide, or other vapor phase reactants which are oxidized to heavy metal oxides, for example. As in the case of tetraethyl lead, the second reactant may be in liquid form so long as it possesses a suitable vapor pressure to provide a sufficient concentration of the reactant for the desired reaction and the desired deposition rate. In such a case, the vapor phase reactant is introduced into the reaction chamber by means of a carrier gas, such as nitrogen or helium.

While not limiting the present invention to a particular theory of operation, Equations (1), (2), and (3) below indicate a proposed reaction sequence for one embodiment of the present invention for the formation of lead silicate. Atomic oxygen is formed by the mercury-sensitized dissociation of nitrous oxide and subsequently reacts with silane and tetraethyl lead [$Pb(Et)_4$] to form lead silicate.

$$Hg_o + h\nu(2537\ \text{Å}) \rightarrow Hg^* \qquad (1)$$

where
h = Planck's constant
$\nu$ = frequency of absorbed radiation
$Hg_o$ = mercury in the ground state
$Hg^*$ = mercury in an excited state $$Hg^* + N_2O \rightarrow O + N_2 + Hg \qquad (2)$$

$$SiH_4 + Pb(Et)_4 + O \rightarrow PbO/SiO_2 + \text{hydrocarbons} \qquad (3)$$

Alternatively, the tetraethyl lead itself may be photodissociated by the $Hg^*$ to form a radical, as shown in Equation (4), which reacts to form the lead silicate.

$$Pb(Et)_4 + Hg^* \rightarrow Pb(Et)_3 \cdot + Et + Hg_o \qquad (4)$$

The $PbO/SiO_2$ shown in Equation (3) represents a mixed oxide of lead and silicon, which is referred to herein as "lead silicate". In accordance with the present invention, the lead oxide content of the lead silicate is chosen to be within the range of 5 to 80 mole percent, and preferably 30 to 40 mole percent, in order to provide both the desired optical properties and the desired environmental stability. The preferred coatings having a lead oxide content of 30 to 40 mole percent have a refractive index of about 1.65 to 1.71.

In order to form the lead silicate coating of the present invention, the process and apparatus described in U.S. Pat. No. 4,371,587 may be used. The proportions of the silane and tetraethyl lead reactants are controlled by use of flow meters to provide predetermined flow rates, which are selected to provide an oxide having the above-discussed mole percentage of lead oxide in the product. The tetraethyl lead is introduced into the reaction chamber by passing an inert gas, such as nitrogen or helium, through a reservoir of liquid tetraethyl lead.

A layer of lead silicate was formed on the surface of each of two germanium substrates in accordance with the present invention as previously described herein. The reactants were silane at a flow rate of 0.9 standard cubic centimeters per minute (sccm), tetraethyl lead introduced at a flow rate of 2 sccm of the nitrogen carrier gas through the tetraethyl lead at 20° C., and nitrous oxide at a flow rate of 50 sccm. The system pressure was 400 millitorr. The substrate temperature was 100° C. Mercury sensitization and 2537 Å radiation from mercury vapor lamps were used. The results of each deposition are summarized in Table I. The chemical composition indicated in Table I was determined by Energy Dispersive Analysis by X-ray (EDAX). Fourier Transform Infrared Spectroscopy (FTIR) was performed on Sample Number 2, and the data obtained was determined to be similar to FTIR data on lead silicate

TABLE I

| Sample No. | Deposition Time (Minutes) | Film Thickness | Refractive Index | Composition (Atom Percent) | | | Oxide Mole Percent | |
|---|---|---|---|---|---|---|---|---|
| | | | | Pb | Si | O | PbO | $SiO_2$ |
| 1 | 40 | 1080 Å | 1.71 | 11.8 | 25.5 | 62.7 | 31.6 | 68.4 |
| 2 | 210 | 2700 Å | 1.71 | 12.4 | 25.1 | 62.5 | 33.1 | 66.9 | films produced by thermal chemical vapor deposition of tetraethyl lead and tetraethylorthosilicate at 300°–450° C., as described in the publication by P.C. Li and P.J. Tsang, "CVD Hydrophobic Lead Silicate Films," *J. Electrochem. Soc: SOLID STATE SCIENCE AND TECHNOLOGY*, Vol. 129, (January 1982), pages 165–172. In general, the infrared spectra show the same characteristic absorption bands peaked at about 1050, 790, and 450 cm$^{-1}$ for $SiO_2$. The addition of PbO in the film produced an absorption at ~650cm$^{-1}$, a shoulder on the 1050cm$^{-1}$ band, and a shift of the 1080 cm$^{-1}$ band (pure $SiO_2$) to smaller wavenumber. The weak, broad peak at 3200–3600cm$^{-1}$ indicates a small amount of water incorporation. Using another series of these samples, it was determined that the water content generally decreased as the lead content of the lead silicate increased. It was noted that the refractive index of 1.71 indicated in Table I was slightly lower than that expected from conventional lead silicate glasses formed at 1500° C. from component oxide materials and having similar compositions. This effect indicates some degree of porosity in the lead silicate films of the present invention, which can be expected due to the much lower temperature at which such films are formed.

In addition, from the data of Table I it can be calculated that the deposition rate for Sample 1 was 27 Å/minute for a 40-minute total deposition time, whereas the deposition rate for Sample 2 was only 13 Å/minute for a total deposition time of 210 minutes. This leveling off of the deposition rate in Sample 2 is due to the accumulation of deposited material on the internal surface of the quartz window of the reaction chamber. These deposits absorb the reaction-inducing radiation which must pass through the window into the reaction chamber. This problem with deposits on the quartz window can be minimized by coating the internal face of the quartz window with Fomblin (a perfluorinated polyether available from Montecatini-Edison Company of Italy). The deposits do not adhere to the Fomblin film. Using such a Fomblin coating, lead silicate has been deposited in accordance with the present invention at an average deposition rate of 100 Å/minute for a total deposition time of 60 minutes.

Moreover, it was determined that the films were not of uniform lead content throughout the substrate surface. Films deposited distant from the gas manifold entrance contained less lead than those deposited close to the gas manifold entrance, due to the depletion of the tetraethyl lead reactant. This non-uniformity of the deposited material presents a significant problem only when the substrate has a large surface area. In such cases, variations in system parameters, such as reactant gas flow rates and pressure, may be necessary in order to achieve uniform composition of the lead silicate film of the present invention.

In order to form a graded index structure, the process and apparatus described in U.S. Pat. No. 4,545,646 are used. The substrate may be formed of any suitable material such as glass, polyacrylic, polycarbonate, or polyallyl materials. The silane and tetraethyl lead reactants are provided in a first predetermined proportion in order to deposit on the substrate a coating having a first predetermined composition and a first predetermined thickness. Next, the predetermined proportions of the silane and tetraethyl lead are varied in a continuous manner to produce corresponding continuous variation in the composition and index of refraction of the coating and to thereby form a coating having a graded index of refraction. Then, the continuous variation in the proportions of reactants is repeated for the number of times required to produce the desired refractive index profile throughout the thickness of the coating. The composition of the coating may vary from pure $SiO_2$ to the lead silicate comprising zero to 80 mole percent lead oxide as previously discussed.

A quarterwave stack filter may be formed in accordance with the present invention by varying the proportions of the silane and tetraethyl lead reactants in a predetermined manner to form discrete layers each with a predetermined index of refraction. For example, the proportions of reactants may be varied so that only silane is introduced into the reaction chamber and a layer of silicon dioxide is deposited. Then, the proportion of reactants is varied to introduce a predetermined amount of tetraethyl lead in addition to the silane and a layer of lead silicate is deposited as previously described. The process is repeated to provide a structure having alternate discrete layers of $SiO_2$ and lead silicate stacked one upon the other. The composition and thickness of each layer is chosen to provide a predetermined refractive index and predetermined optical properties in the final stacked structure, as is known in the art.

A quarterwave optical stack coating was formed in accordance with the present invention as previously described. The stack comprised 14 alternating layers of $SiO_2$ with a refractive index of 1.46 and lead silicate with a refractive index of 1.69. The lead silicate comprised about 50 mole percent lead oxide. Separate structures were formed on numerous substrates comprising an acrylic material, a polycarbonate material, or a glass material, as indicated by the notations "A", "P", or "G" respectively in FIG. 1. The structures were then exposed to water vapor, specifically 100 percent relative humidity at room temperature (25° C.) and at 50° C. As a control, some structures were exposed to dry nitrogen at room temperature. Using a spectrophotometer and known analysis methods, the peak wavelength (i.e. the wavelength at which the maximum reflectance is obtained) was determined for each sample at various points over a period of 127 days. FIG. 1 presents the data obtained in a curve showing peak wavelength versus time in days. The data of FIG. 1 show that the structures formed in accordance with the present invention exhibit essentially no shift in peak wavelength upon extended exposure to 100 percent relative humidity at 25° C. and at 50° C. The slight variations in peak wavelength shown in FIG. 1 are within the error limits inherent in the measurement process. The distribution of peak wavelengths in the various samples is due to the non-uniformity of the deposition rate and refractive index of the deposited material over the surface of the substrate, as previously noted. When used in an optical structure, it is highly desirable, if not imperative, that optical coatings maintain the peak wavelength of reflection in a steady state. Otherwise the performance of such a structure is unreliable and hence, unsuitable for many applications.

Figure 2:
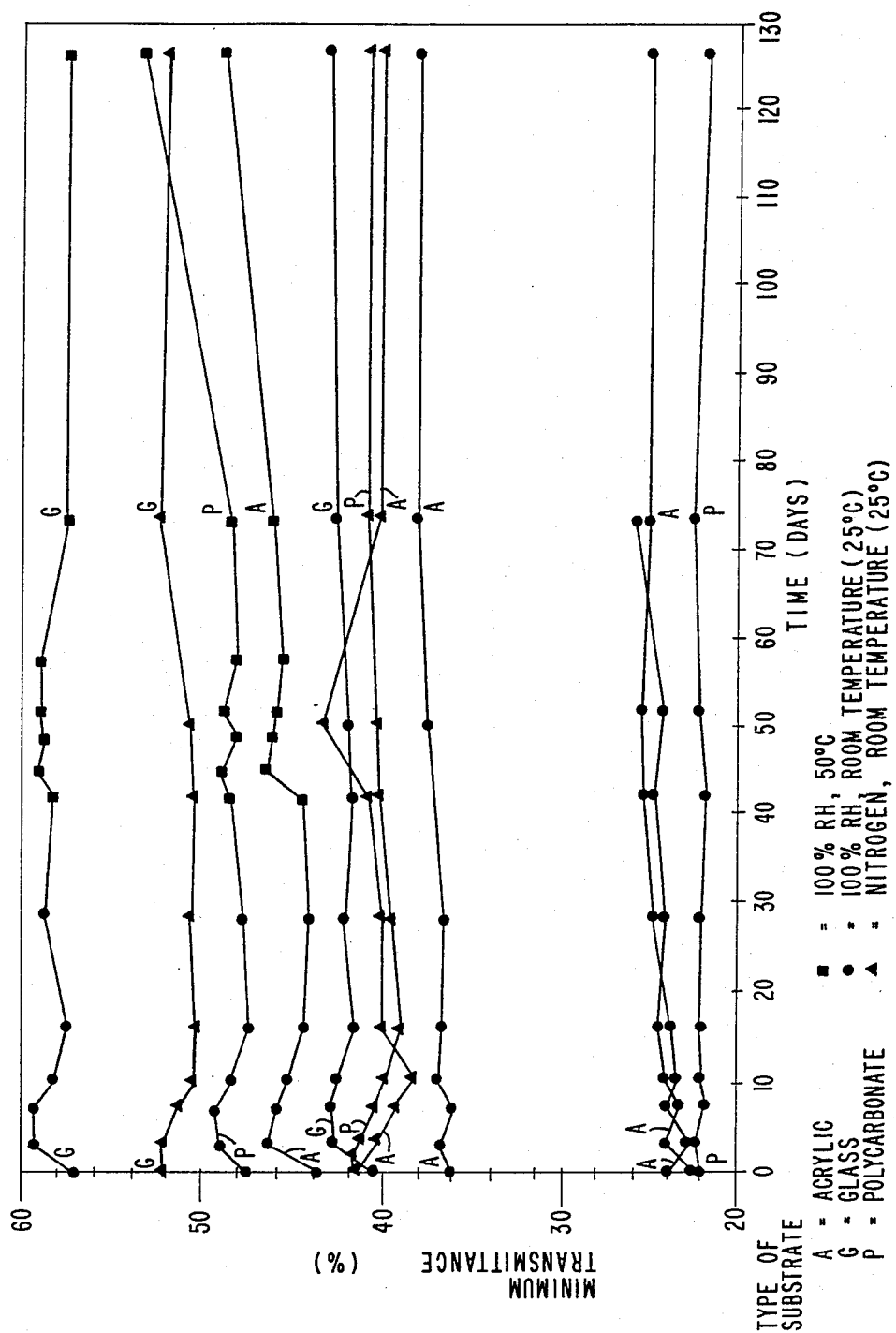
FIG. 2 presents a graph showing the stability of the optical transmittance of various coatings formed in accordance with the present invention, upon extended exposure to water vapor.

Additional data was obtained to indicate the percent minimum transmittance of the above-noted structures when exposed to 100 percent relative humidity at 25° C. and at 50° C. The minimum transmittance of each sample was measured by known spectrophotometric methods at various points over a period of 127 days. FIG. 2 presents the data obtained in a curve showing percent minimum transmittance versus time in days. The data of FIG. 2 show that the structures formed in accordance with the present invention exhibit essentially no shift in minimum transmittance upon extended exposure to 100 percent relative humidity at 25° C. and at 50° C. The slight variations in transmittance shown in FIG. 2 are within experimental error. When used as a diffraction optical element in which light of a selected wavelength is reflected or transmitted, it is highly desirable that the percent transmittance be maintained at a stable level in order to meet application requirements such a high optical density for protective filters against laser radiation.

Stacked structures which were the same as those described above were formed except that the lead silicate comprised 80 mole percent lead oxide and 20 mole percent silicon dioxide. These structures exhibited a sharp increase in transmittance upon initial exposure to 100% relative humidity, but after several days, no further increases were observed other than random fluctuations. For some applications, the initial change in transmittance does not present any problems. However, it appears that the higher PbO content may affect the ultimate stability of the structure when used as a filter.

Figure 3:
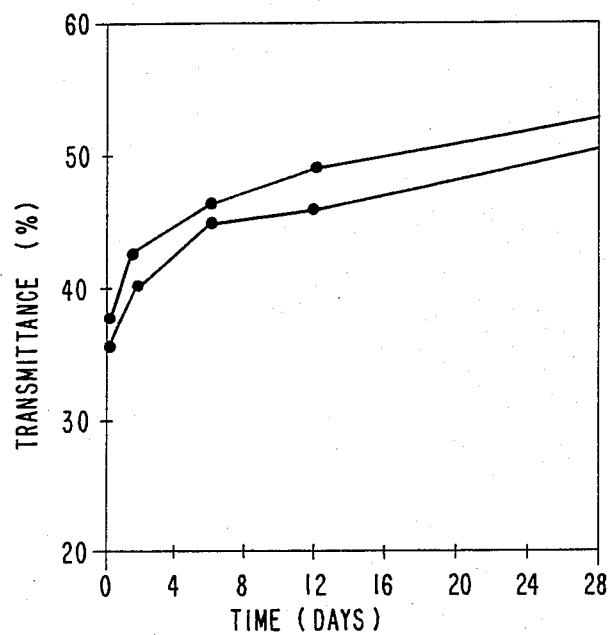
FIG. 3 presents a graph showing the shift in optical transmittance produced in two prior art optical filters upon exposure to water vapor.

For purposes of comparison, FIG. 3 presents data showing the unstable properties of a prior art structure upon exposure to 100 percent relative humidity at room temperature (25° C.). The prior art structure was formed as a quarterwave optical stack on a glass substrate and comprised layers of $SiO_2$ alternating with layers of $SiO_x$. Both the $SiO_2$ and $SiO_x$ were deposited by photochemical vapor deposition. The percent transmittance of two such structures was measured by spectrophotometric means. FIG. 3 presents the data obtained in a curve showing percent minimum transmittance versus time in days. The data of FIG. 3 shows that the prior art structure exhibits a significant change in minimum transmittance upon exposure to water vapor, namely changing from about 35 percent to about 50 percent within 28 days. Thus, the optical performance of such a structure is significantly altered over a period of time. By comparing the data presented in FIGS. 2 and 3, it is evident that the structure formed in accordance with the present invention has significantly enhanced environmental stability as compared to the closest known prior art structure.

Because the stability of the above-discussed stacked structure in accordance with the present invention is due to the properties of the lead silicate material itself, it follows that other structures formed from the present lead silicate material will exhibit similar environmental stabilty. In particular, a graded index structure incorporating lead silicate formed in accordance with the present invention will also be resistant to water vapor over extended periods of exposure.

Further, because of the resistance of the lead silicate of the present invention to water vapor, the process of the present invention may also be used to apply a protective or passivation coating on the surface of a substrate, such as an integrated circuit or photovoltaic detector.

Moreover, in order to provide additional stability, an optical coating according to the present invention may be provided with a protective cap layer of silicon dioxide approximately 1000–5000 Å thick in order to protect the structure from liquid water. The silicon dioxide cap layer is deposited by known photochemical vapor deposition methods immediately after deposition of the lead silicate and without exposure of the lead silicate surface to the environment. Other suitable materials which can be deposited by photochemical vapor deposition may be used, such as the polymers described in U.S. Pat. No. 4,547,395 and U.S. patent application Ser. No. 674,619, now U.S. Pat. No. 4,588,609 both assigned to the present assignee. Other known water-resistant materials may alternatively be used and may be deposited by other methods. In addition, a silicon dioxide cap layer deposited by photochemical vapor deposition may be provided in order to protect the coating prior to the deposition of another protective material by another method.

Thus, in accordance with the present invention there is provided an optical coating which has high optical performance and exhibits high environmental stability, specifically to water vapor. The present invention possesses all of the advantages of the known graded index structures of U.S. Pat. No. 4,545,646, which have been previously discussed in detail. Further, the present invention has the significant additional advantage of providing a structure which maintains stable optical properties upon extended exposure to water vapor. Moreover, since the lead silicate of the present invention is formed by a low temperature photochemical vapor deposition process (i.e. 30° to 200° C.), such a process is well suited for forming optical coatings on plastic or other temperature-sensitive substrates since it avoids thermal damage to the substrate. In addition, the lead silicate formed by the present process exhibits good adhesion to plastic and glass substrates and forms a conformal coating on curved surfaces. Further, the coatings of the present invention exhibit low optical scattering, low absorbance (i.e. high see-through), and good abrasion resistance. These properties make the present invention particularly well suited for forming helmet visor displays, head up displays, and laser eye protection visors and goggles.

While the present invention has been particularly described with respect to the preferred embodiments thereof, it will be recognized by those skilled in the art that certain modifications in form and detail may be made without departing from the intention and scope of the invention. These modifications are intended to be included within the scope of the present invention.

What is claimed is:

1. A low temperature photochemical vapor diposition process for forming on the surface of a chosen substrate an environmentally stable optical coating comprising silicon dioxide and lead oxide, said process comprising the steps of:

(a) providing said substrate;
(b) providing a first selected vapor reactant containing silicon, and a chosen oxygen-containing precursor which are capable of reacting upon inducement by radiation of a selected wavelength to form a stoichiometric silicon dioxide material;
(c) providing a second selected vapor phase reactant containing lead, which is capable of reacting with said chosen oxygen-containing precursor upon inducement by said radiation of said selected wavelength to form a stoichiometric lead oxide material which is resistant to the absorption of water vapor;
(d) exposing said substrate at a temperature within the range of 30° C. to 200° C. to said first and second vapor phase reactants in predetermined proportions and said oxygen-containing precursor in the presence of said radiation to deposit said coating on said substrate wherein said coating has a uniform composition and comprises silicon dioxide containing 25–80 mole percent of said lead oxide and said coating exhibits enhanced stability in optical properties upon sustained exposure to water vapor.

2. The process according to claim 1 which further includes performing said exposing of step "d" in the presence of mercury vapor to sensitize said reacting upon said inducement by said radiation as set forth in steps "b" and "c".

3. The process according to claim 1 or 2 wherein said first vapor phase reactant is silane.

4. The process according to claim 1 or 2 wherein said chosen oxygen-containing precursor is selected from the group consisting of nitrous oxide, nitrogen dioxide, and molecular oxygen under selected pressure and flow rate conditions.

5. The process according to claim 1 or 2 wherein said substrate is formed from a plastic or temperature-sensitive material.

6. A process according to claim 2 wherein:
(a) said first selected vapor phase reactant is silane;
(b) said chosen oxygen-containing precursor is nitrous oxide;
(c) said second selected vapor phase reactant is tetraethyl lead;
(d) said wavelength of said radiation is 2537 angstroms.

7. A process according to claim 6 wherein:
(a) the flow rate of said silane is 0.9 standard cubic centimeters per minute (sccm);
(b) the flow rate of said nitrous oxide is 50 sccm;
(c) the flow rate of nitrogen carrier gas through said tetraethyl lead at 20° C. is 2 sccm; and
(d) said coating comprises approximately 30 mole percent lead oxide.

* * * * *